United States Patent
Brown et al.

(10) Patent No.: US 6,613,498 B1
(45) Date of Patent: Sep. 2, 2003

(54) MODULATED EXPOSURE MASK AND METHOD OF USING A MODULATED EXPOSURE MASK

(75) Inventors: David R. Brown, Huntsville, AL (US); Barry S. McCoy, Huntsville, AL (US); Gerald Tuck, Huntsville, AL (US); Miles Scott, Huntsville, AL (US); Bruce Peters, Huntsville, AL (US)

(73) Assignee: MEMS Optical LLC, Huntsville, AL (US)

( * ) Notice: Subject to any disclaimer, the term of this patent is extended or adjusted under 35 U.S.C. 154(b) by 0 days.

(21) Appl. No.: 09/397,133

(22) Filed: Sep. 16, 1999

Related U.S. Application Data

(60) Provisional application No. 60/100,728, filed on Sep. 17, 1998.

(51) Int. Cl.[7] .................................................. G03F 7/00
(52) U.S. Cl. ........................ 430/322; 430/323; 430/321
(58) Field of Search .............................. 430/314, 322, 430/323, 321

(56) References Cited

U.S. PATENT DOCUMENTS

| | | | |
|---|---|---|---|
| 4,016,062 A | | 4/1977 | Mehta et al. |
| 4,842,969 A | | 6/1989 | Kawatsuki et al. ............. 430/5 |
| 4,895,790 A | * | 1/1990 | Swanson et al. ............ 430/321 |
| 5,004,673 A | | 4/1991 | Vlannes ...................... 430/325 |
| 5,013,494 A | | 5/1991 | Kubo et al. |
| 5,279,924 A | | 1/1994 | Sakai et al. |
| 5,340,637 A | * | 8/1994 | Okai et al. .................. 428/167 |
| 5,482,800 A | * | 1/1996 | Gal ................................ 430/5 |
| 5,830,605 A | | 11/1998 | Umeki et al. .................. 430/5 |

FOREIGN PATENT DOCUMENTS

| | | |
|---|---|---|
| JP | 59-172723 | 9/1984 |
| JP | 2-151862 | 6/1990 |
| JP | 9-146259 | 6/1997 |
| WO | WO 00/16162 | 3/2000 |

OTHER PUBLICATIONS

Ernst–Bernhard Kley, "Continuous profile writing by electron and optical lithography", Microelectronic Engineering, Elsevier Publishers BV, Amsterdam, NL, vol. 34, No. 3–4, Dec. 1, 1997, pp. 261–298.

Michael T. Gale, et al., "Fabrication of Continuous–Relief micro–Optical Elements by Direct Laser Writing in Photoresists", Optical Engineering, Soc. Of Photo–Optical Instrumentation Engineers, Bellingham, US, vol. 33, No. 11, Nov. 1, 1994, pp. 3556–3566.

* cited by examiner

Primary Examiner—Rosemary Ashton
Assistant Examiner—Amanda C. Walke
(74) Attorney, Agent, or Firm—Smith, Gambrell & Russell, LLP

(57) ABSTRACT

A photolithographic process includes providing a layer of photoresistive material on a target substrate. Radiation is transmitted to the photoresistive material through a layer of absorbing material that absorbs the radiation with a transmittance proportional to the thickness of the absorbing material. A surface relief structure is formed in the absorbing material, so that the photoresistive material is only partially exposed in a pattern corresponding to the surface relief structure. Thus, when the photoresistive material is developed, it has a surface relief structure corresponding to the surface relief structure in the absorbing material. Etching the developed photoresistive material and target substrate then forms a surface relief structure in the target substrate that corresponds to the surface relief structure in the developed photoresistive material.

15 Claims, 7 Drawing Sheets

MODULATED EXPOSURE MASK AND METHOD OF USING A MODULATED EXPOSURE MASK

CONTINUATION APPLICATION INFORMATION

This application is a continuation-in-part application of provisional U.S. patent application Ser. No. 60/100,728, filed on Sep. 17, 1998, which provisional patent application is incorporated entirely herein by reference.

FIELD OF THE INVENTION

This invention relates to a modulated exposure mask for use with conventional photolithographic processes. The mask has a layer of material that absorbs radiation in proportion to its thickness. Further, this absorbing material is shaped so that the amount of radiation absorbed by the mask varies over its surface. A modulated exposure mask according to the invention can be used to create a continuously variable surface topography on a target substrate.

BACKGROUND OF THE INVENTION

Conventional photolithographic processes are commonly used to make a variety of miniature structures ranging from semiconductor devices to microlens arrays. According to typical conventional photolithographic processes, a target substrate is covered with a photoresistive material (i.e., photoresist). Portions of the photoresist are then exposed to radiation through a mask. The mask embodies a design that completely blocks the radiation from striking selected portions of the photoresist, while fully exposing the other portions of the photoresist. This type of photolithographic mask, that either completely blocks or fully passes incident light, will hereafter be referred to as a "binary" photolithographic mask.

After the exposure, the exposed portions of the photoresist are removed by a chemical reaction, while the unexposed portions remain (or vice versa). The entire surface, including both the remaining portions of the photoresist material and the uncovered portions of the underlying target substrate, then is etched by a conventional etching process, such as ion milling. This etching process etches the uncovered portions of the target substrate to form the desired structure in the substrate.

One problem with such conventional photolithographic processes, however, is that they will only form a structure with a "binary" topography. That is, these processes will only form a structure with substantially two distinctive heights or levels: a lower level where the photoresist was removed, and an upper level where the remaining photoresist material covered the substrate. (While imperfections in the photolithographic process, such as diffraction, will cause some variation between the levels at their interfaces, these variations are insubstantial in that they typically cannot be controlled to benefit the structure.)

As the demand for more complex miniature structures has increased, a variety of solutions to this problem have been sought. One well-known proposed solution to this problem is the multi-step photolithographic method discussed in, for example, U.S. Pat. Nos. 4,895,790, 5,161,059, and 5,218,471 to Swanson et al. This process, shown representatively in FIG. 1, uses repeated photolithographic cycles to create multi-level structures.

Discussing this process in more detail, the first process cycle begins with a target substrate 110 covered with a layer of photoresist 120. The photoresist 120 is exposed to ultraviolet light through a first binary mask 130. The exposed portions of the photoresist 120 then are removed, and a dry etch process is used to etch the uncovered portions of the target substrate. This first process cycle produces a two-level structure.

To obtain a multi-level structure, the two-level structure undergoes a second process cycle. The target substrate 110, now having two levels, is covered with a second layer of photoresist 140. Portions of this second layer of photoresist 140 are then exposed to ultraviolet light by a second binary mask 150. The exposed portions of the second photoresist layer 140 are removed, and a second dry etch process etches the uncovered portions of the target substrate 110 to create a structure with four distinct levels. Additional photolithographic cycles can be employed to produce structures with, for example, eight, sixteen, and thirty-two different levels.

This multi-step photolithographic method has several problems, however. First, the process is time consuming and labor intensive, because it requires a conventional photolithographic process to be performed a number of times. Also, each binary mask must be carefully aligned with the substrate so that its exposure exactly corresponds with the structure formed by the previous photolithographic method. Still further, this multi-step photolithographic method can only produce structures with discrete, i.e., "binary," levels. This method cannot be used to produce a structure with a continuously variable, i.e., "analog," topography, as desired in the art.

Accordingly, other methods have been proposed to produce miniature structures with a continuously variable topography. One type of method, the "direct write" method, uses a high energy density, finely controlled beam to etch material from or deposit material onto the target substrate in order to form the desired structure. Alternatively, such a beam is used to form a desired topography in a layer of photoresist material prior to a conventional etching process. The direct write method can be implemented with a variety of high energy beams, such as a focused ion beam, a high-energy laser beam, and an electron beam. See, for example, U.S. Pat. No. 5,541,411 to Lindquist et al., U.S. Pat. No. 5,148,419 to Gratrix et al., and U.S. Pat. No. 5,811,021 to Zarowin.

The direct write method has problems as well, however. Because each topographical feature must be individually cut, this method is time consuming, and often impractical for creating large devices (i.e., devices greater than a few square millimeters in area). Also, unlike photolithographic processes, devices can only be produced individually by the direct write method, making it impractical for any purpose requiring more than just a few devices. Moreover, the direct write method requires highly expensive equipment, such as a focused ion beam generator or electron beam generator.

Other methods have been proposed to obtain continuously variable topographies with photolithographic processes that employ specialized masks. For example, U.S. Pat. Nos. 5,310,623 and 5,482,800 to Gal teach the use of a "gray scale" lithography process. This process employs a binary mask, as with conventional lithographic processes, but the opaque portions of the mask are made up of very small pixels (e.g., 1–100 microns). These pixels are arranged so that the overall image provided by the mask is a gray scale image, like those produced by photocopying machines. That is, these small pixels are arranged so that the percentage of light transmitted by the mask as a whole varies over its surface. With this process, however, the mask must be reimaged by a reduction stepper that inherently has a limited fidelity. Thus, as a practical matter, the application of this gray scale lithography process is typically limited to relatively small devices (e.g., 0.5 inches).

Yet another type of photolithographic method for obtaining a continuously variable or analog topography is the holographic/interferometric type method. This method selectively exposes photoresist to a pattern of radiation caused by interference between multiple coherent beams of radiation. With this method, however, the difficulty in properly setting up the interference pattern limits the surface relief structures that are achievable. Further, only one device can be produced with each holographic/interferometric process, making this method impractical for any use requiring more than just a few devices.

Still another photolithographic method for producing a continuously variable topography is disclosed in U.S. Pat. Nos. 4,567,104, 4,670,366, 4,894,303, 5,078,771, and 5,285,517 to Wu. As described in those patents, this method employs a mask formed from specially doped/implanted high energy beam sensitive (HEBS) glass, which becomes opaque in proportion to its exposure to electron beam radiation. The mask is thus created by exposing portions of the glass to varying amounts of electron beam radiation, so that the opacity of the mask varies over its surface. This method has the drawback, however, that the HEBS glass has a very low sensitivity to the exposing electron beam. It therefore takes a relatively long write time to create a mask, resulting in slow production time and increased cost.

OBJECT AND SUMMARY OF THE INVENTION

It is therefore an object of the invention to provide a photolithographic process that can easily, quickly and inexpensively produce a structure or device with a continuously variable topography. It is a further object of the invention to provide a photolithographic mask that creates a continuously variable topography with a single photolithographic process step. It is yet an additional object of the invention to provide a method of forming a photolithographic mask that will produce a continuously variable topography with a single photolithographic process step.

According to the invention, a single photolithographic step process produces a structure with a continuously variable (i.e., analog) surface topography. The invention utilizes a modulated exposure mask with a light absorbing material continuously varying in thickness over the primary surface of the mask. This continuously varying thickness of the light absorbing material causes the mask to correspondingly spatially modulate the amount of light it transmits. Thus, in a photolithographic process using the modulated exposure mask, the exposure and subsequent removal of the photoresist vary continuously over the surface of the target substrate.

The photolithographic modulated exposure mask according to the invention can be formed using, for example, the direct write method (e.g., partial electron beam exposure) described above. One preferred method of forming the modulated exposure mask employs a material that absorbs radiation of a desired wavelength, such as ultraviolet light. A layer of this absorbing material, approximately a few microns thick, is positioned on a thicker layer of material transparent to the desired wavelength to form a target substrate. A layer of electron beam resist is then formed over the layer of absorbing material. Next, an electron beam partially exposes the e-beam resist to produce a surface relief structure in the resist. This surface relief structure is then transferred into the thin layer of absorbing material to form the mask according to the invention.

DETAILED DESCRIPTION OF THE PREFERRED EMBODIMENTS

Figure 1:
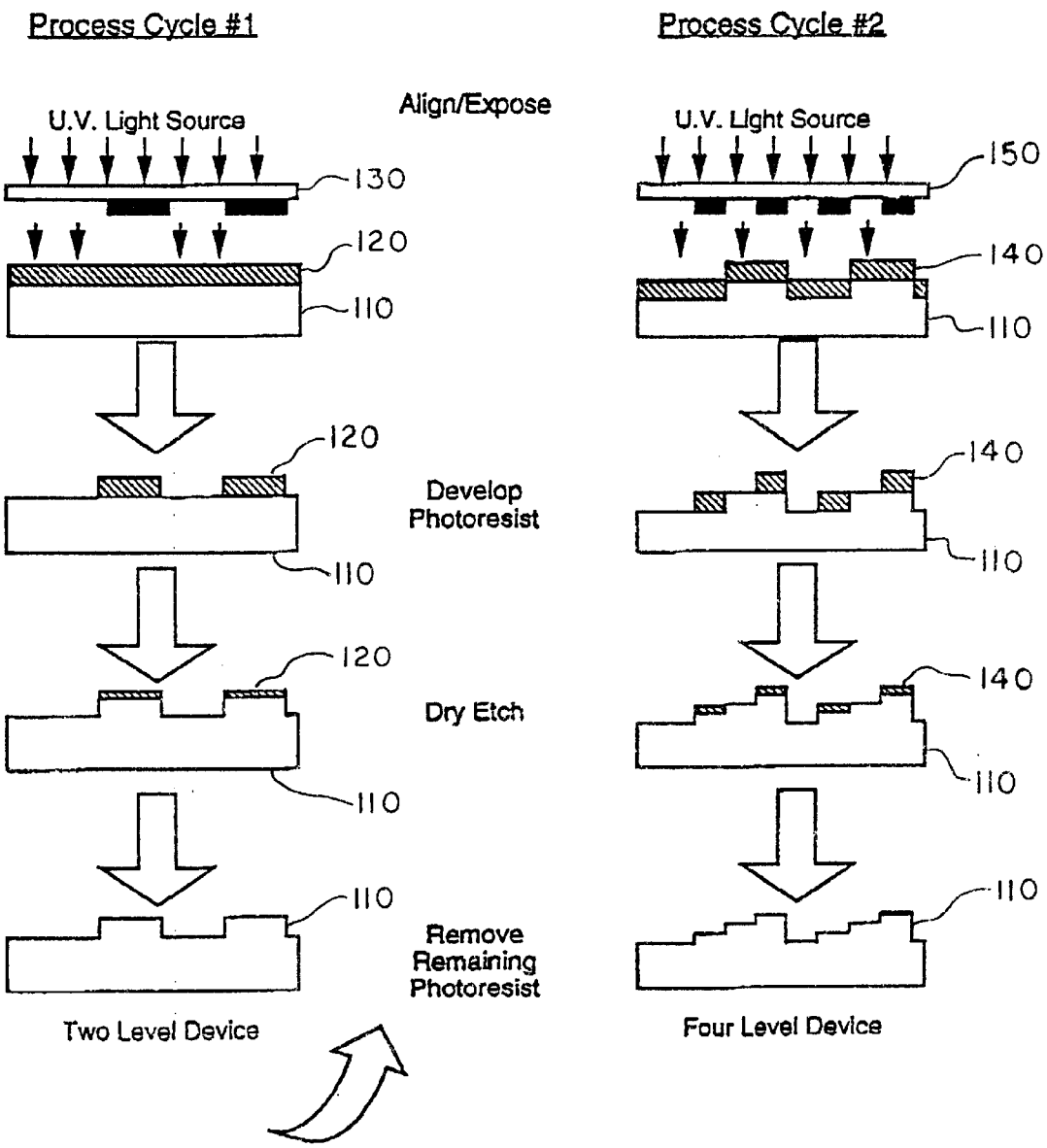
FIG. 1 is a diagram schematically illustrating a conventional photolithographic process.

One preferred photolithographic process according to the invention will be explained with reference to FIGS. 2(a)–2(c). In these figures, a modulated exposure mask 210 includes a layer of material 220 that absorbs ultraviolet light, such as SiO. This layer of absorbing material 220 has a continuously varying surface relief structure. (The particular surface topography of the absorbing material 220 is produced according to a formula that will be discussed in detail below.) This absorbing material 220 is preferably very thin (e.g., a few microns in thickness), and is affixed to a base 230 for mechanical robustness. The base 230 is formed from material transparent to ultraviolet light, such as quartz. The modulated exposure mask 210 will thus absorb ultraviolet light according to the surface relief topography of the absorbing material 220, with the amount of absorption being directly related to the thickness of the absorbing material 220.

The specific absorption pattern embodied in the modulated exposure mask 210 can then be used to control the exposure of photoresist material in a photolithographic process. As seen in FIG. 2(a), the modulated exposure mask 220 is positioned between an ultraviolet light source and a target substrate 240. The target substrate 240 is covered with a layer of photoresistive material 250. The modulated exposure mask 210 causes a differential (i.e., non-uniform) passage of ultraviolet light through the mask to the resist material 250. As will be understood by those of ordinary skill in the art, the more ultraviolet light that reaches the resist material 250, the greater the exposure of the resist material 250. Thus, the exposure of the resist material 250 continuously varies over its surface in a profile corresponding to the absorption pattern of the modulated exposure mask.

Figure 2:
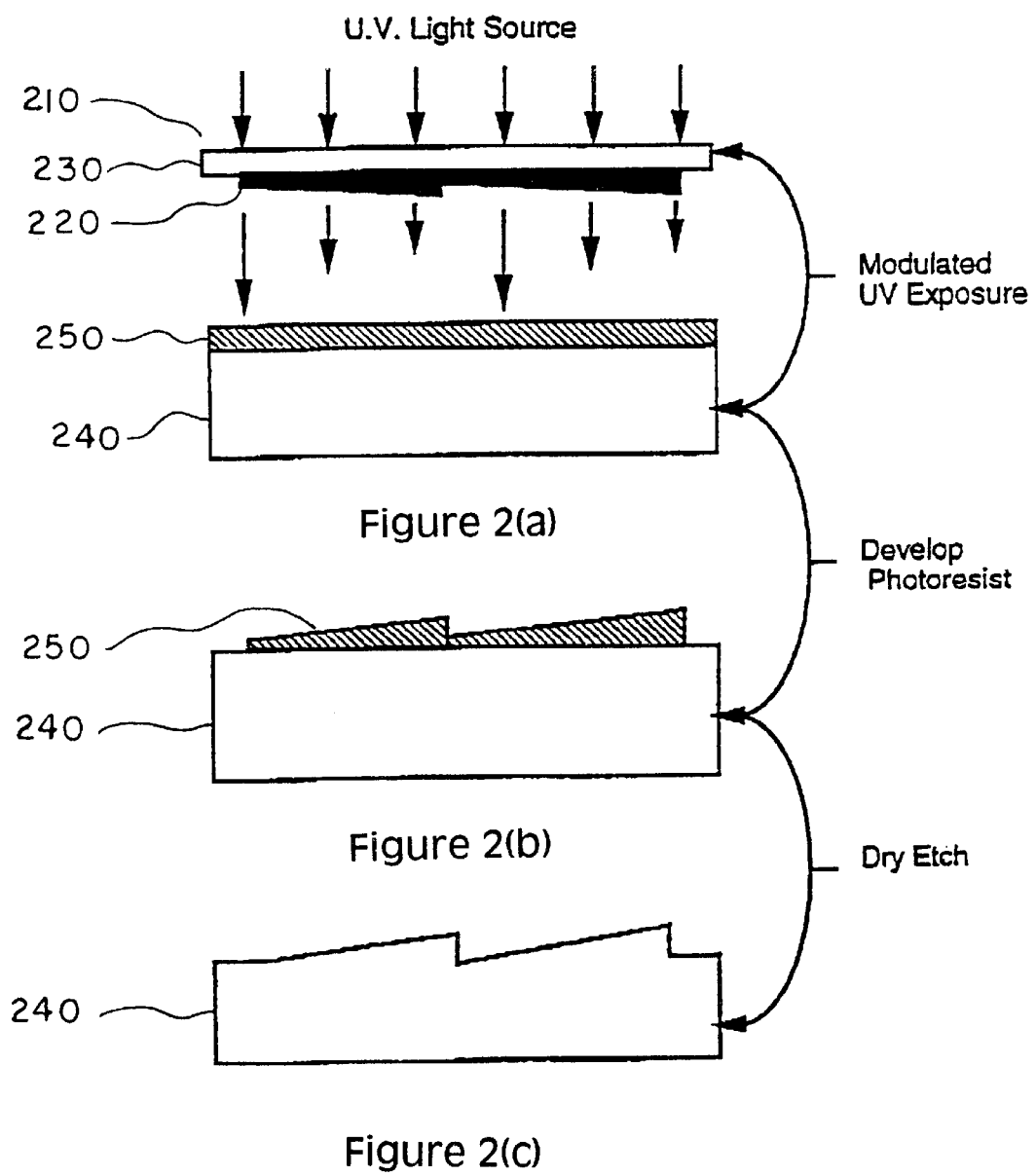
FIGS. 2(a)–2(c) are diagrams schematically illustrating a photolithographic process according to one embodiment of the invention.

After the resist material 250 is developed, it will have a surface relief structure that is a function of the degree of exposure of the resist material 250 to the ultraviolet light, as seen in FIG. 2(b). This surface topography in turn corresponds to the topography of the absorbing material 220. The surface relief structure in the photoresist material 250 is then transferred to the target substrate 240 with a conventional etching procedure, such as a dry etch in an ion mill or a reactive ion etcher. (See FIG. 2(c)). Thus, a modulated exposure mask according to the invention can be employed to produce a structure with a desired continuously variable surface relief. As will be appreciated by those of ordinary skill in the art, however, there are several factors that should be taken into account in order to properly make and implement a modulated exposure mask according to the invention. Each of these factors will be discussed in detail below.

The first factor is the ability to faithfully transfer a surface relief structure (e.g., a multi-level/analog surface profile) formed in the photoresist into the target substrate. This may be accomplished with a variety of well-known etching processes, including dry, chemically-assisted and wet etches. Ion milling and reactive ion etching are two examples of such well-known etching processes capable of etching both photoresist material and most desirable substrate materials.

Those of ordinary skill in the art will appreciate that, by controlling the relative etch rate of the photoresist to the etch rate of the target substrate, the vertical dimensions of the structure to be formed in the developed photoresist can be scaled appropriately. That is, the scale of the structure formed in the target substrate can be controlled by either selection of the scale for the structure formed in the developed photoresist, or selection of the relative etch rate of the photoresist to the substrate. (See, e.g., "Fabrication of Micro-Optical Devices" by W. W. Anderson et al., *Conf. on Binary Optics, NASA Conference Publication* 3227, Feb. 23–25, 1993.)

For example, with a reactive ion etch, the etching rate of the photoresist can be increased by increasing the level of oxygen in the etching plasma. The ratio of the etch rate of the substrate (Rs) to the etch rate of the photoresist (Rp) is called the selectivity, and is given by formula 1:

$$S = Rs/Rp \quad [1]$$

Figure 3:
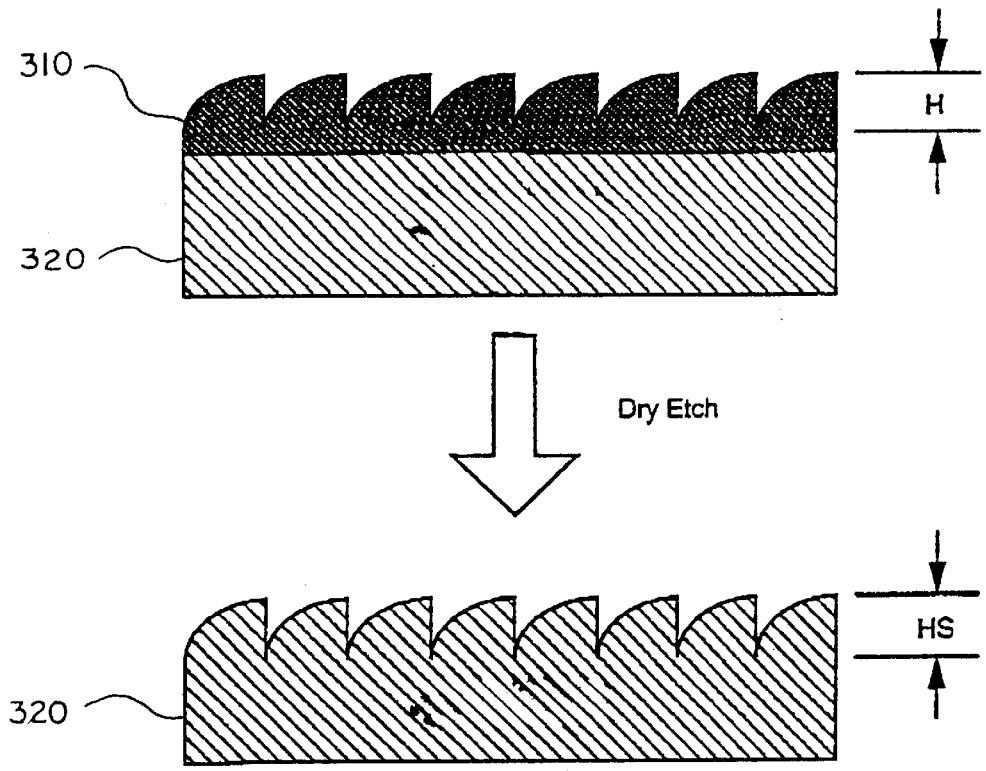
FIG. 3 is a diagram graphically illustrating the etch rate of a substrate (Rs) relative to the etch rate of photoresist (Rp).

As will be seen from FIG. 3, if the height of the developed photoresist structure 310 is H, then the height of the structure transferred into the substrate 320 is HS.

The second factor to be considered is the ability to create a relief structure (e.g., a multi-level or analog surface profile) in photoresist. For a single photolithographic process step to produce a multi-level or analog structure, partial or intermediate amounts of photoresist must remain after its exposure and subsequent development. This will typically be accomplished by underexposing or partially exposing the photoresist layer, as most photoresist materials have a binary type exposure reaction. For example, with a typical positive photoresist material, unexposed areas are nearly unaffected upon development, while exposed areas are nearly completely removed upon development.

Figure 4:
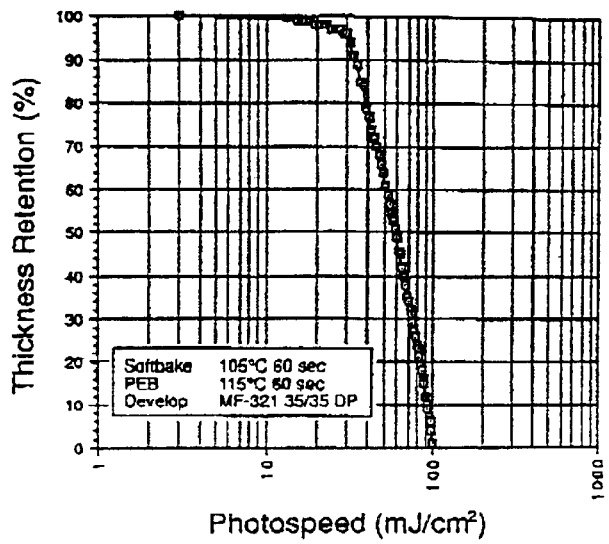
FIG. 4 shows a contrast curve for Shipley photoresist S3813 that has been developed with the Shipley MF-321 developer.

This exposure reaction information is commonly referred to as the contrast or gamma curve of the resist material. An example of such a curve is shown in FIG. 4. This curve is for Shipley photoresist S3813 that has been developed with Shipley MF-321 developer. (Shipley is a well known supplier of photoresistive and developer materials.) From this curve, it will be seen that energy densities between 30 and 100 mJ/cm$^2$ will provide intermediate levels of remaining resist, making it possible to form a complex surface relief structure in this photoresist. Any nonlinearities in the contrast curve can be compensated for in the design of the mask. This type of photoresist is high contrast and therefore highly non-linear, however, making it relatively difficult to use to obtain a multi-level analog photoresist structure.

Figure 5:
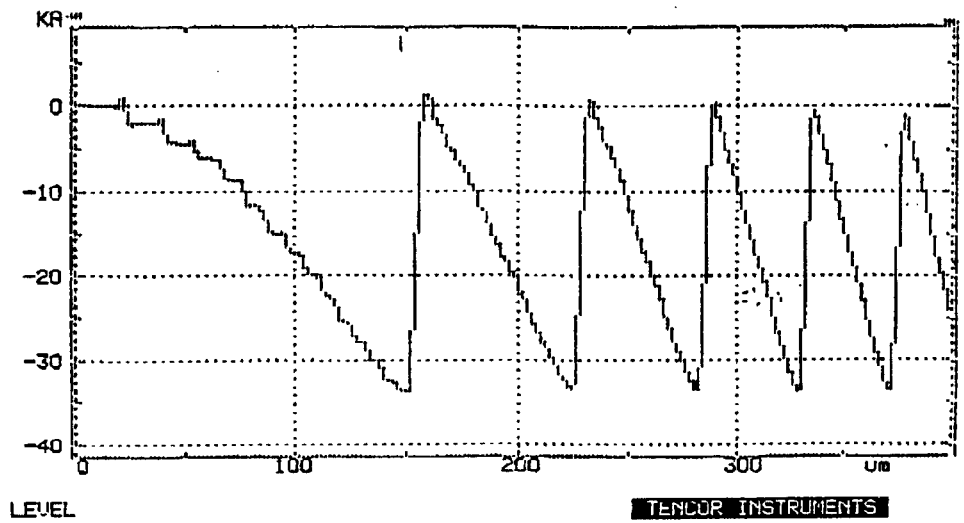
FIG. 5 shows a structure produced by developing partially exposed Shipley photoresist STR1110.

As will be readily understood by those of ordinary skill in the art, it is instead preferable to use a photoresist material that is not high contrast, and most preferable to use a photoresist material with a contrast curve having linear characteristics over the applicable energy range. The Shipley 1000 series of photoresist materials have been shown to produce a fairly linear response. A structure resulting from developing partially exposed Shipley photoresist STR1110 is shown in FIG. 5. This structure was produced using an analog mask formed from HEBS glass according to the process described above. The mask had a linear transmission profile and the resulting photoresist structure was measured using a Tencore profilometer. There are also AZ resists that give similar results. While these are just two brands of well-know photoresist materials, any conventional photoresist material can be employed in the photolithographic process according to the invention. As previously noted, the photoresist material should preferably have a contrast curve as close to linear as possible for the applicable energy range.

A third factor is the ability to spatially modulate the energy of the exposure radiation (e.g., ultraviolet light) in order to produce a desired multi-level/analog surface profile in the photoresist. This is accomplished by varying the thickness of the absorbing material in the mask. As known by those of ordinary skill in the art, the relationship between the energy input into the absorbing material (Ei) and the corresponding energy output from the absorbing (Eo), as a function of the absorbing material thickness, is given by formula 2:

$$E_o = E_i e^{\frac{-4\pi k(\lambda)d}{\lambda}} \quad [2]$$

where d is the thickness of the absorbing material and k is the imaginary part of the refractive index of the material, which is a function of the wavelength of light ($\lambda$) and is often referred to as the absorption coefficient. From this, one can see that the percentage of energy transmitted by the absorbing material can be controlled by varying the thickness d of the absorbing material.

Solving formula 2, for the thickness d and with spacial dependence x and y, gives the form the absorbing material must take to produce a given transmittance T:

$$d(x, y) = \frac{-\lambda}{4\pi k(\lambda)} \ln\left[\frac{E_o(x, y)}{E_i}\right] = \frac{-\lambda}{4\pi k(\lambda)} \ln[T(x, y)] \quad [3]$$

From formula 3, it will be understood that, to produce a linear transmittance function, the thickness of the absorbing material must have a natural logarithmic profile. Thus, two characteristics should be considered when selecting an absorbing material for the mask.

First, the absorbing material should have an absorption coefficient such that the required thicknesses of the absorbing layer are workable. From experience, the minimum transmittance of the absorbing material is given by $$T = \frac{Eo}{Ei} > 0.25 \quad [4]$$

This places a limit on the maximum value of the ratio $k(\lambda)d/\lambda$ in the exponent of formula 2 of:

$$\frac{k(\lambda)d}{\lambda} < 0.22 \quad [5]$$

Therefore, a lower limit for thickness d should be assigned that is reasonable to obtain.

The factor that normally dominates this decision is the ability to repeatably obtain a given thickness profile. The etching characteristics of the material chosen and the equipment used to facilitate the etching process are key to the repeatability of the process. In general, however, for most materials that can be etched in a reactive ion etcher using a Fluorine chemistry or materials that can be ion milled, d should be chosen as $$0.5 \text{ microns} < d < 1.5 \text{ microns} \quad [6]$$

given an acceptable range of the ratio:

$$0.15 < \frac{k(\lambda)}{\lambda} < 0.44 \quad [7]$$

For example, SiO is just one material that has this acceptable range for the wavelength of ~0.39 microns<$\lambda$<~0.44 microns. This wavelength range includes the H and G lines of Mercury arc lamps commonly used in conventional lithographic processes. As will be understood, however, employing different etching chemistries, such as chlorine based chemistry, or different etching techniques, such as a wet chemical etch, can affect the range set forth in formula 6. Of course, those of ordinary skill in the art will understand how to modify the range set forth in formula 6 accordingly.

The second characteristic to consider when choosing an appropriate absorbing material is its mechanical properties in a thin film coating form. The absorbing material should be able to be grown, sputtered, or deposited in some fashion onto the base substrate in a uniform manner so that it adheres to the base substrate. If the mask is to be used as a contact mask, it also should be able to survive periodic cleaning. Further, the absorbing material should not degrade with time due to its exposure to radiation during use.

The fourth factor in implementing a modulated exposure mask according to the invention is the ability to fabricate the surface relief structure in the absorbing material necessary to create the desired modulation in the exposure of the photoresist. As will be appreciated by those of ordinary skill in the art, the desired surface topography of the absorbing material can be produced by any appropriate conventional technique, including the conventional lithographic and direct-write methods discussed above. For example, if the absorbing material is to have a "binary" multi-level profile, then that profile can be formed using the multistep lithographic process shown in FIG. 1. Alternately, if the absorbing material is to have an "analog," continuously varying profile, then the profile can be formed using any of the direct write methods or the HEBS glass method discussed above.

Figure 6:
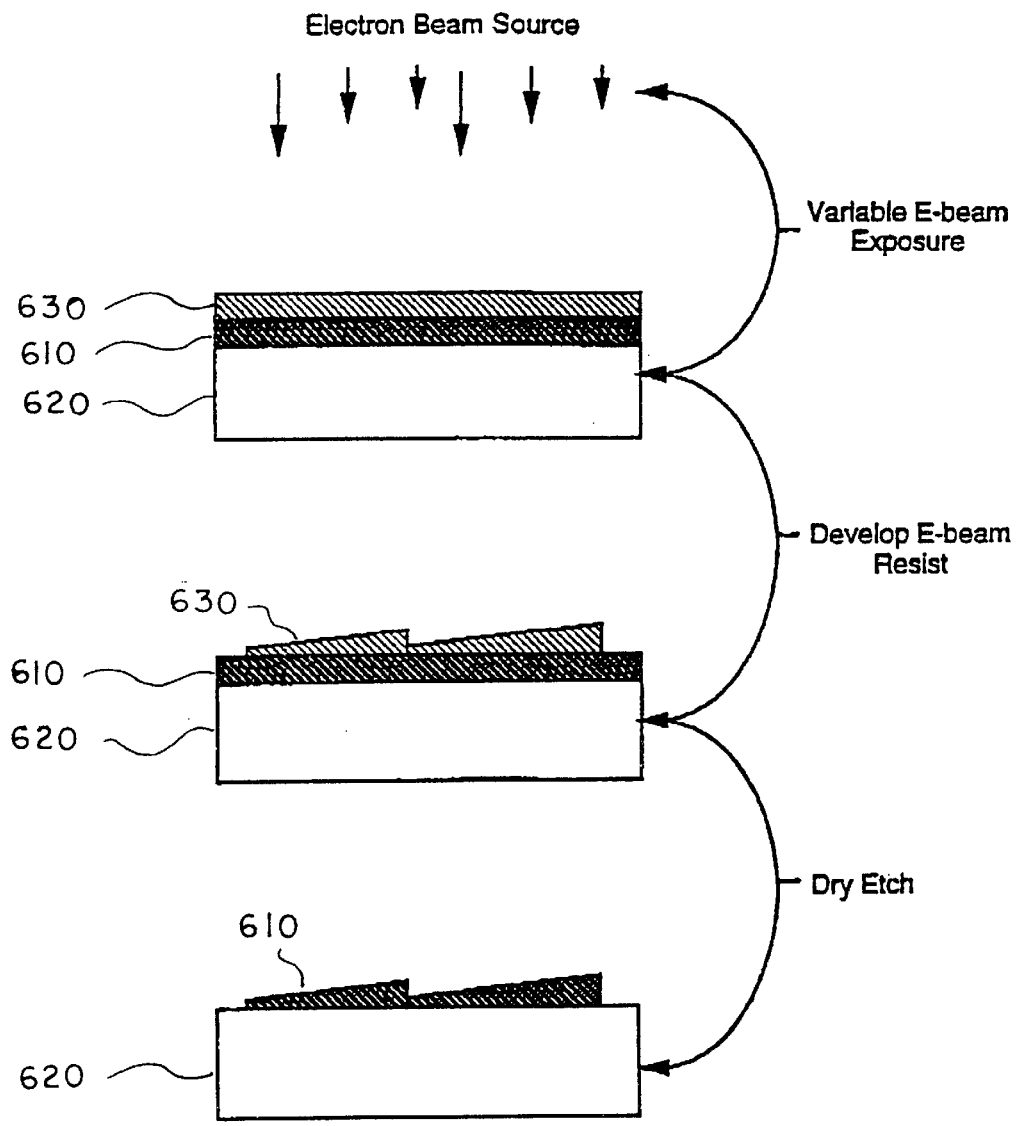
FIG. 6 illustrates a direct write electron beam process for forming a modulated exposure mask according to one embodiment of the invention.
Figure 7:
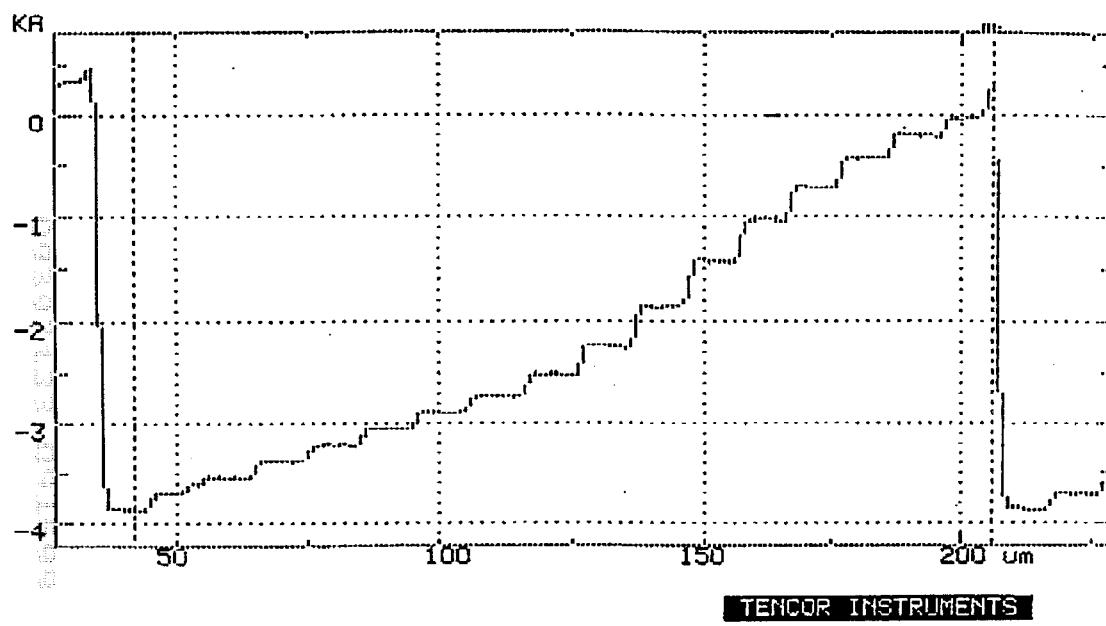
FIG. 7 shows the results of varying the amount of charge delivered to an electron beam sensitive resist material.

To obtain an analog surface relief structure, the necessary topography preferably is formed on the absorbing material by the direct write electron beam (e-beam) process described above, as illustrated in FIG. 6. In this process, the absorbing material 610 is positioned on a base substrate 620, and covered with a layer of electron beam resist material 630. The electron beam sensitive resist is partially exposed by an electron beam. The amount of charge delivered to the e-beam resist varies according to the topography to be produced in the absorbing material 610. FIG. 7 shows the results of varying the amount of charge delivered to an e-beam sensitive resist according to the direct write method. In this figure, a 17-level surface relief structure is formed in the e-beam resist material. This structure can then be faithfully transferred to the absorbing material below the e-beam resist. Utilizing an e-beam sensitive resist material provides a shorter write time with the electron beam than other methods, such as the HEBS glass approach.

One alternate way to create a desired surface relief structure in the absorbing material is to sputter the material onto a base substrate using a focused ion beam (FIB). This process is attractive due to the lesser number of processing steps required than with the electron beam direct write method. It has a significant drawback, however, in that a focused ion beam generally can remove or deposit fewer than 3 cubic microns per minute. This translates into relatively long write times to produce a modulated exposure mask for even a very small device. This write time can be reduced by choosing an absorbing material with a relatively high absorption coefficient, such as a metal. This decreases the volume of material that must transferred to or from the base substrate.

Another alternate method of forming a modulated exposure mask, which is perhaps the most economical, is to use the "gray scale" approach described above. For a repeating pattern whose dimensions are less than the field size of the stepper, the pattern could be stepped and repeated over the entire mask to create a large contact or stepper mask. For patterns that are larger than the field size of the stepper, a series of masks aligned using the stepper could be employed to produce a larger unique pattern.

Figure 8A:
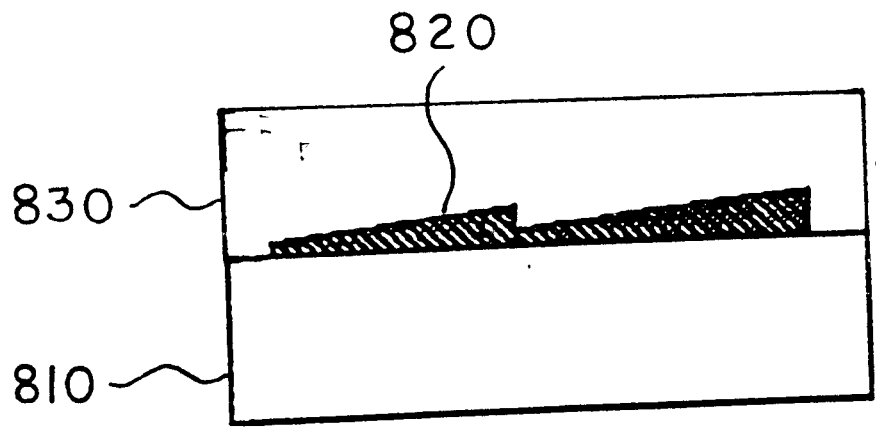
FIGS. 8(a) and 8(b) illustrate embodiments of a modulated exposure mask according to two other embodiments of the invention.
Figure 8B:
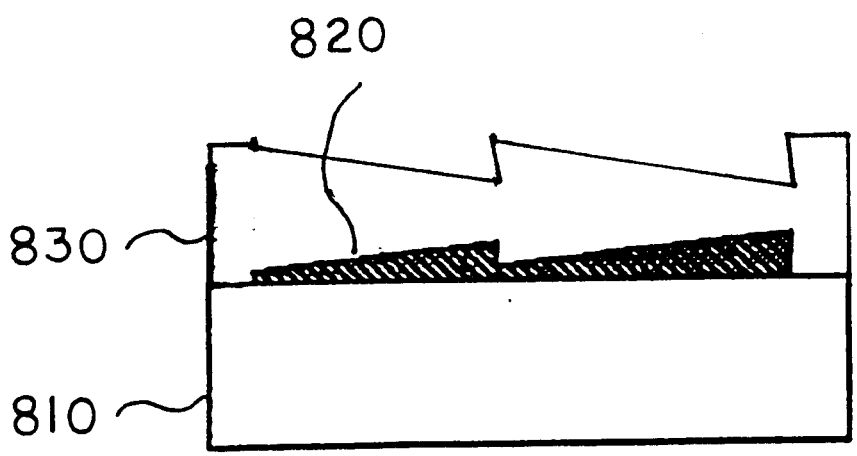

In one preferred embodiment of the invention, the modulated exposure mask includes a transparent protective layer formed over the absorbing material. Thus, the modulated exposure mask has a base substrate 810, a layer of absorbing material 820 with the desired surface relief structure, and a transparent protective layer 830 as shown in FIGS. 8(a) and 8(b). The transparent protective layer 830 can be applied in any fashion (e.g., deposited, sputtered, grown, etc.).

The transparent protective layer provides at least three important advantages. First, it protects the absorbing material from the photoresist during contact lithography, during cleaning, and from the environment in general. For some embodiments, the protective layer can be applied thickly enough to produce a flat outer surface for the mask, as shown in FIG. 8(a). Making the outer surface of the modulated exposure flat (or nearly so) reduces small crevices where contaminates can adhere.

Second, if the material for the protective layer is selected to have the same or nearly the same index as the absorbing material, it will reduce or eliminate phase distortions caused by the topography of the absorbing material. This advantage can be significant for manufacturing structures with features that are so small as to be near the resolution limit of the lithography method of choice.

The third advantage offered by the transparent protective layer is to increase the functionality of the mask by offering a platform upon which a phase modulation function could be added to the mask. That is, by providing a surface relief structure in the transparent coating, as shown in FIG. 8(b), a complex phase function can be added to the mask. The resulting modulated exposure mask would thus modulate both the amplitude and the phase of the illumination source in a lithographic process. More particularly, the amplitude of the radiation would be modulated by the layer of absorbing material, while the phase would be modulated by the surface relief structure in the transparent layer. The phase and amplitude layers of the mask would have to be aligned by standard aligning techniques, but this feature could be used to increase the resolution of the lithographic process, as is well known in the art of phase shift masking technology.

This embodiment of the modulated exposure mask could also be exploited to create desired complex patterns for holographic lithography. Conventional holographic lithography relies on the coherent summation of interfering beams or orders of light to create a pattern. The complexity of the pattern that currently can be created is limited to the number of orders of light that can be interfered and the intensity and phase control of each order. These orders of light are typically created using bulk macro optics, such as mirrors and prisms.

A complex amplitude and phase modulated exposure mask according to the invention could be structured to produce an arbitrary number of orders with various amplitude and phase weights. This use would allow for very complex patterns to be produced holographically. Because holographic lithography has a very large depth of focus (many millimeters), it allows high resolution lithography on curved surfaces. Thus, for example, a diffractive optical element, a Fresnel optical element, a refractive micron lens array or a surface relief anti-reflective structure could be added to the curved surface of a bulk macro refractive lens. The high resolution of holographic lithography offered by this embodiment of the modulated exposure mask would also allow the mask pattern to be scaled by reimaging of the pattern as is often done in steppers. It should further be noted that, because holographic lithography is a non-imaging, far-field lithography, the "gray scale" approach discussed above could be employed to modulate the amplitude of transmitted radiation instead of the absorbing material layer.

While the embodiments of the modulated exposure mask discussed above have included a shaped layer of absorbing material formed on a base substrate, the invention is not limited to this embodiment. For example, a sufficiently strong (i.e., mechanically robust) layer of absorbing material can be used alone as the modulated exposure mask, without the base substrate. Also, the absorbing layer could be formed as part of a bulk mask substrate. For example, when HEBS glass is completely flood-exposed (and thus darkened), the darkened material is confined to a layer a few microns thick just below the surface. A surface relief structure could be etched into this darkened layer to form a modulated exposure mask according to the invention.

While particular embodiments of the invention have been described above, it will be appreciated that the invention is not limited to these embodiments. For example, SiO and quartz have been mentioned as materials for the absorbing layer and the base substrate, respectively. It will be apparent to those of ordinary skill in the art, however, that a number of alternate materials could be used for both, depending upon the type of photolithographic process to be employed. Also, those of ordinary skill in the art will appreciate that the invention is applicable to a variety of lithographic processes using any wavelength of radiation (e.g., x-ray, visible light, etc.).

Further, while the modulated exposure mask has been particularly described for lithographic processes, those of ordinary skill in the art will understand that the modulated exposure mask according to the invention can be employed for other purposes. That is, the modulated exposure mask can be used as an amplitude/intensity/energy modulator for other applications.

Thus, while the invention has been described in conjunction with various embodiments, these embodiments are illustrative only, and should not be considered limiting. Many alternatives, modifications and variations that fall within the scope of the appended claims will be apparent to persons skilled in the art in light of the foregoing detailed description.

We claim:

1. A photolithographic process, comprising:

providing a layer of photoresistive material on a target substrate;

partially exposing the photoresistive material by transmitting radiation to the photoresistive material through a layer of absorbing material that
(1) absorbs the radiation with a transmittance proportional to the thickness of the absorbing material, and
(2) has a surface relief structure formed therein;

developing the photoresistive material to form a surface relief structure in the developed photoresistive material that corresponds to the surface relief structure in the absorbing material; and etching the developed photoresistive material and target substrate to form a surface relief structure in the target substrate that corresponds to the surface relief structure in the developed photoresistive material.

2. The process according to claim 1, wherein the surface relief structure on the target substrate has an analog topography.

3. The process according to claim 1, wherein the etching step is performed with a dry etching process.

4. The process according to claim 1, wherein the etching step is performed with a wet etching process.

5. The process according to claim 1, wherein the etching step is performed with a chemically assisted etching process.

6. The process according to claim 1, wherein the photoresistive material has a linear contrast curve in the applied energy range of the transmitting radiation.

7. A photolithographic process, comprising:

providing a layer of photoresistive material on a target substrate;

partially exposing the photoresistive material by transmitting radiation to the photoresistive material through a layer of absorbing material that
(1) absorbs the radiation with a transmittance proportional to the thickness of the absorbing material, and
(2) has a surface relief structure formed therein;

developing the photoresistive material to form a surface relief structure in the developed photoresistive material that corresponds to the surface relief structure in the absorbing material.

8. The process according to claim 7, wherein the surface relief structure in the developed photoresistive material has an analog topography.

9. The process according to claim 7, wherein the photoresistive material has a linear contrast curve in the applied energy range of the transmitting radiation.

10. A photolithographic process, comprising:

providing a layer of photoresistive material on a target substrate;

partially exposing the photoresistive material by transmitting radiation to the photoresistive material through a layer of absorbing material that
(1) absorbs the radiation with a transmittance proportional to the thickness of the absorbing material, and (2) has a surface relief structure formed therein; and etching the photoresistive material and target substrate to form a surface relief structure in the target substrate that corresponds to the surface relief structure in the photoresistive material.

11. The process according to claim 10, wherein the surface relief structure on the target substrate has an analog topography.

12. The process according to claim 10, wherein the etching step is performed with a dry etching process.

13. The process according to claim 10, wherein the etching step is performed with a wet etching process.

14. The process according to claim 10, wherein the etching step is performed with a chemically assisted etching process.

15. The process according to claim 10, wherein the photoresistive material has a linear contrast curve in the applied energy range of the transmitting radiation.

\* \* \* \* \*